United States Patent [19]

Takahashi et al.

[11] Patent Number: 4,975,635
[45] Date of Patent: Dec. 4, 1990

[54] VOLTAGE DETECTOR USING A SAMPLING TYPE HIGH-SPEED PHOTODETECTOR

[75] Inventors: Hironori Takahashi, c/o Hamamatsu Photonics Kabushiki Kaisha, No. 1126-1, Ichino-cho, Hamamatsu-shi, Shizuoka; Shinichiro Aoshima, Shizuoka; Takuya Nakamura, Shizuoka; Yutaka Tsuchiya, Shizuoka, all of Japan

[73] Assignee: Hironori Takahashi, Shizuoka, Japan

[21] Appl. No.: 264,706

[22] Filed: Oct. 31, 1988

[30] Foreign Application Priority Data

Nov. 5, 1987 [JP] Japan ............................ 62-280159
Nov. 5, 1987 [JP] Japan ............................ 62-280161

[51] Int. Cl.⁵ .................... G01R 31/00; G01R 29/12
[52] U.S. Cl. ............................... 324/96; 324/158 R; 324/158 D; 350/356; 350/358; 250/213 VT
[58] Field of Search ............... 324/158 R, 96, 158 D, 324/77 K; 356/318, 368; 250/213 VT, 227; 350/356, 374, 376

[56] References Cited

U.S. PATENT DOCUMENTS

| | | | |
|---|---|---|---|
| 4,446,425 | 5/1984 | Valdmanis et al. | 324/77 K |
| 4,594,511 | 6/1986 | Cooper et al. | 356/318 |
| 4,611,920 | 9/1986 | Tsuchiya | 250/213 VT |
| 4,645,918 | 2/1987 | Tsuchiya et al. | 250/213 VT |
| 4,655,593 | 4/1987 | Storck et al. | 356/300 |
| 4,659,921 | 4/1987 | Alfano | 250/213 VT |
| 4,681,449 | 7/1987 | Bloom et al. | 356/364 |
| 4,683,420 | 7/1987 | Goutzoulis | 324/73 R |
| 4,855,591 | 8/1989 | Nakamura et al. | 324/96 |
| 4,866,372 | 9/1989 | Aoshima et al. | 324/96 |

FOREIGN PATENT DOCUMENTS

| | | |
|---|---|---|
| 0154701 | 9/1985 | European Pat. Off. |
| 0160209 | 11/1985 | European Pat. Off. |
| 0197196 | 10/1986 | European Pat. Off. |
| 2125543 | 3/1984 | United Kingdom |
| 2202639 | 3/1988 | United Kingdom |

Primary Examiner—Reinhard J. Eisenzopf
Assistant Examiner—Vinh P. Nguyen
Attorney, Agent, or Firm—Finnegan, Henderson, Farabow, Garrett, and Dunner

[57] ABSTRACT

A voltage detector for measuring the voltage waveform of an object being measured on the basis of the optical intensity signal corresponding to the voltage of the object, including a light source for generating light, an optical modulator for converting the light from the light source into an optical intensity signal corresponding to the voltage of the object, and a sampling type high-speed photodetector for sampling the optical intensity signal from the optical modulator and measuring the voltage waveform of the object on the basis of the sampled optical intensity signal.

12 Claims, 5 Drawing Sheets

FIG. 9(a) — QUANTITY OF CW LIGHT
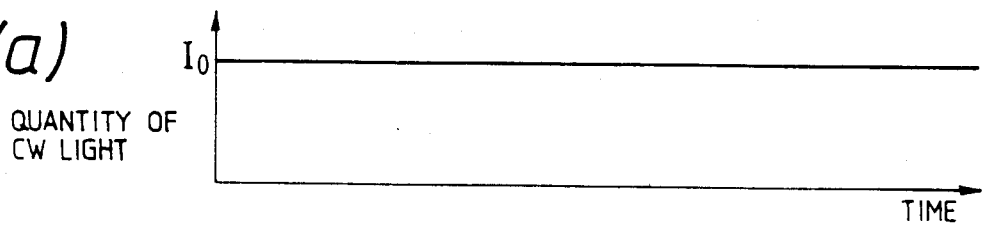
FIG. 9(b) — QUANTITY OF CHOPPED CW MEASURED
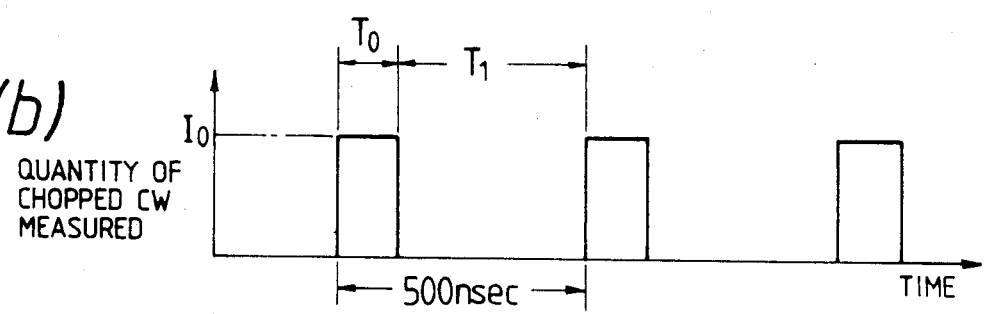
FIG. 9(c) — VOLTAG FROM OBJECT BEING MEASURED
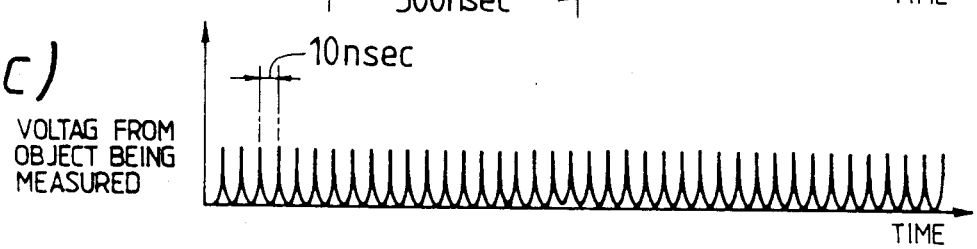
FIG. 9(d) — OPTICAL INTENSITY SIGNAL
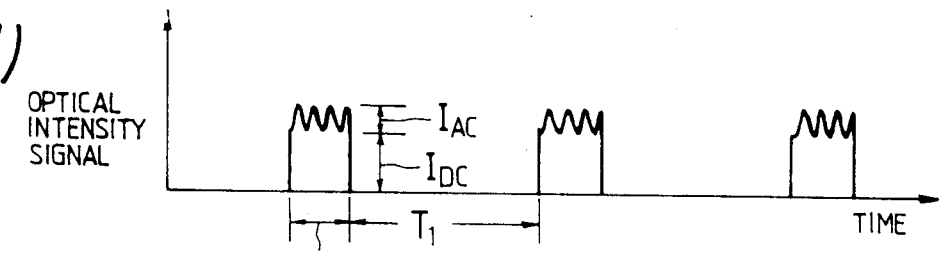
FIG. 9(e) — OUTPUT SIGNAL
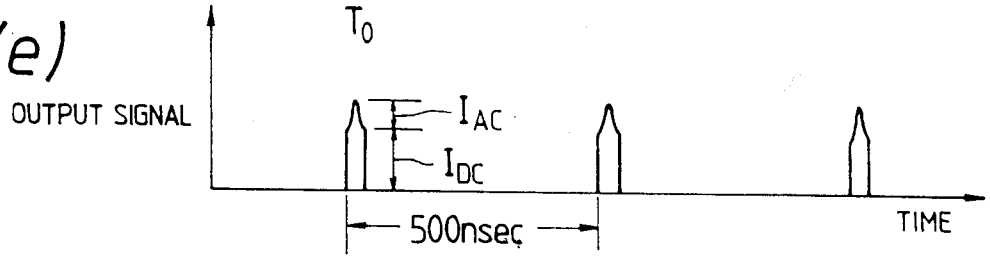

VOLTAGE DETECTOR USING A SAMPLING TYPE HIGH-SPEED PHOTODETECTOR

BACKGROUND OF THE INVENTION

This invention relates to a voltage detector including an optical modulator for detecting voltages of an object being measured with a time resolution of the order of picoseconds.

A voltage detector using an optical modulator to detect voltages of the object being measured has been known in the art. FIG. 1 and 2 are block diagrams for showing the arrangements of the conventional voltage detectors which have been disclosed in U.S. Pat. No. 4,446,425 and European Patent Unexamined Application No. 0,197,196 published by European Patent Office on Oct. 5, 1986, respectively.

In the voltage detector as shown in FIG. 1, a pulse light source 50 outputs a short light pulse of the order of 120 femtoseconds repeatedly. The short light pulse thus outputted is split into two light pulses by separating means such as a splitter (not shown). One of the light pulses is applied through a chopper 51 and a variable delay unit 52 to an object 53 being measured such as a photo-electric switch, while the other light pulse is applied to an optical modulator 40. The optical modulator 40 comprises a polarizer 55, a Pockels cell 54, a phase compensator 56, and an analyzer 57. Utilizing the phenomenon that the short light pulse applied to the modulator is modulated with a voltage provided by the object 53 being measured, the optical modulator 40 can detect a voltage waveform of the object 53 as optical intensities.

This mechanism will be described in more detail. A voltage to be detected, which is outputted by the object 53 in synchronization with the short light pulse, is applied to the Pockels cell 54 in the optical modulator 40, while a specified polarization component extracted from the short light pulse by the polarizer 55 is applied to the Pockels cell 54. The Pockels cell 54 employs an electro-optic material such as $LiNbO_3$ or $LiTaO_3$ whose refractive index is changed by applying a voltage thereto. Owing to the above nature of the electro-optic material, the short light pulse applied to the Pockels cell 54 is changed in polarization according to the voltage applied from the object 53 to the Pockels cell. That is, the short light pulse is modulated with the voltage of the object to emit from the Pockels cell. The emergent light beam from the Pockels cell is applied through the phase compensator 56 to the analyzer 57. The analyzer 57 extracts two orthogonal polarization components of the emergent light beam from the phase compensator 56, and applies the two orthogonal polarization components as modulated optical intensity signals to photodetectors 58 and 59, respectively. The photodetector 58 and 59 detect the optical intensities of the polarization components, respectively. The output signals of the photodetectors 58 and 59 are applied to a differential amplifier 60, where the difference between the output signals is amplified. The output of the differential amplifier 60 is applied through a lock-in amplifier 61 and a signal averager 62 to display 63, so that the result of detection is displayed on the display 63.

The variable delay unit 52 is used to gradually delay the time at which the object 53 generates a voltage, thereby to determine sampling points for the voltage waveform. The lock-in amplifier 61 is used to amplify only the specified frequency component of the output signals from differential amplifier 60, which is determined by the frequency of the chopper 51, so that noise components are reduced The signal averager 62 operates to average the output signals of the lock-in amplifier 61.

When a voltage V is applied to the Pockels cell 54 of the optical modulator 40 in the voltage detector thus constructed, the optical intensity I of the emergent light beam which is applied to the photodetector 59 shows the V-I characteristic as shown in FIG. 3 (a). When no output voltage of the object 53 is applied to the Pockels cell 54 in the optical modulator 40, the optical intensity I of the emergent light beam applied to the photodetector 59 is changed in correspondence with the set value of the phase compensator 56. Therefore, if the set value of the phase compensator 56 is so selected that the optical intensity of the emergent light beam applied to the photodetector 59 is 50% of the maximum optical intensity $I_0$, as is apparent from the V-I characteristic as shown in FIG. 3 (a), the optical modulator is operated in such a manner that a voltage of an operating point $V\pi/2$ is seemingly applied to the Pockels cell where $V\pi$ is the voltage required for obtaining the maximum optical intensity $I_0$ and is called a "half-wave voltage". In this case, the operating point is set at point A. When with the phase compensator 56 thus set, a modulation voltage $\Delta V$ from the object 53 as shown in FIG. 3 (b) is applied to the optical modulator 40, the optical intensity I of the emergent light beam incident from the analyzer 57 to the photodetector 59 is shown in FIG. 3 (c). As is apparent from FIG. 3 (a) to FIG. 3 (c), at the operating point A the optical intensity I of the emergent light beam from the analyzer 57 changes most remarkably and substantially in proportion to the applied voltage, so that the maximum AC component $I_{AC}$ can be obtained. On the other hand, at the operating point A, the optical intensity I includes a DC component $I_{DC}$. However, as the difference between the two output signals having opposite phases, which are provided by the photodetectors 58 and 59, is amplified by the differential amplifier 60, the DC component $I_{DC}$ is removed and only the AC component $I_{AC}$ can be accurately detected as a voltage detection result. The output of the differential amplifier 60 is applied to the lock-in amplifier 61, where only the frequency component determined by the frequency of the chopper, for example $1KH_Z$ is amplified, with the result that the noise components are reduced.

In the voltage detector as shown in FIG. 2, as a CW light beam from a CW light source 70 is applied through an optical modulator 40 to a streak camera 71, the optical intensity of an emergent light beam from a polarizer 57, which changes with the output voltage of the object 53, is observed with the streak camera The output of the streak camera 71 is applied through a lock-in amplifier 61 and a signal averager 62 to a display unit 63, to thereby detect the voltage. The generation of a voltage by the object 53 and the operation of the lock-in amplifier 61 are in synchronization with the output pulse of a pulse generator 72. A phase shifter 73 causes a sweep voltage applied to a deflector (not shown) in the streak camera 71 to be gradually shifted in phase from the output pulse of the pulse generator 72.

As the voltage detector thus constructed employs the streak camera 71 as a photodetector, the operating point is necessarily set at B in FIG. 3 (a). That is, it is impossible to provide a streak camera with a large dynamic range, and if the DC component $I_{DC}$ of the optical intensity I is large, then the AC component $I_{AC}$ as a signal to be detected cannot be observed. Therefore, the set value of the phase compensator 56 is so determined that the optical intensity of the light beam applied to the streak camera 71 is minimum when the voltage V applied to the optical modulator 40 is zero (0) volt, and therefore the operating point is set at B.

At the operating point B, the DC component $I_{DC}$ can be made extremely small, and therefore the modulation degree MOD that is a ratio of $I_{AC}$ to $I_{DC}$ can be made maximum. Thus, it is also possible to observe the AC component $I_{AC}$ with the streak camera 71 having a small dynamic range. The AC component $I_{AC}$ is reduced at the operating point B, more than at the operating point A. However, it is increased by the function of multiplication of the streak camera 71 so that it can be observed.

In the voltage detector as shown in FIG. 1 the maximum AC component $I_{AC}$ can be obtained at the operating point A, however, the optical intensity I also includes the DC component $I_{DC}$. Therefore, the conventional detector is still disadvantageous in that it cannot use a streak camera which functions as a general high-speed photodetector having a small dynamic range, and must use a pulse light source expensive in price and difficult to operate.

On the other hand, in the voltage detector as shown in FIG. 2, the DC component $I_{DC}$ is greatly reduced at the operating point B, and therefore the CW light source 70 and the streak camera 71 can be used in combination. However, the detector is also disadvantageous in that, as the streak camera having small dynamic range is used the operating point is fixed at B, that is it cannot be freely changed, and the detector is short of flexibility.

Further, in the voltage detectors as shown in FIGS. 1 and 2, it is possible to obtain the maximum AC component $I_{AC}$ or the maximum modulation degree MOD, however, there is no maximization of the S/N ratio.

Still further, in the voltage detector as shown in FIG. 1, the noise components are removed from the output of the differential amplifier 60 by means of the lock-in amplifier 61. However, since the differential amplifier 60 applies the difference between the output signals of the photodetectors 58 and 59 having a low response speed to the lock-in amplifier 61, the signal to be detected is greatly deformed when applied to the lock-in amplifier 61, and therefore the modulated signal, that is, the AC component $I_{AC}$ cannot be accurately amplified by the lock-in amplifier 61.

Still further, the sampling frequency of the lock-in amplifier 61 is as low as 100 KHz owing to its time constant. Therefore, the lock-in amplifier 61 suffers from a difficulty that it is impossible to increase the sampling frequency to reduce the noise components, especially the 1/f noise component.

SUMMARY OF THE INVENTION

An object of this invention is to provide a voltage detector having high flexibility in which the operating point can be set freely.

Another object of the invention is to provide a voltage detector in which the S/N ratio is made largest to detect voltages with high accuracy.

A further object of the invention is to provide a voltage detector which can accurately measure signals to be detected, and can reduce noise components greatly.

A still further object of this invention is to provide a voltage detector which can detect the voltage from an object being measured with high sensitivity and with high linearity, while the photodetector is maintained unsaturated even when the quantity of light from the light source is large.

The foregoing objects of the invention have been achieved by the provision of a voltage detector according to the first aspect of the invention, which comprises a light surce for generating light, an optical modulator for outputting an optical intensity signal corresponding to a voltage to be detected and a sampling type high-speed photodetector for detecting the optical intensity signal outputted from the optical modulator.

Further, the foregoing objects of the invention has been achieved by the provision of a voltage detector according to the second aspect of the invention, which comprises a light source for generating light, an optical modulator for outputting an optical intensity signal corresponding to a voltage to be detected, and a sampling type high-speed photodetector for detecting the optical intensity signal outputted from the optical modulator and chopper means for chopping the optical intensity signal before applied to the sampling type high-speed photodetector.

In the voltage detector of the first aspect of the invention, the voltage from the object being measured is applied to the optical modulator and the polarization of the incident light beams to the optical modulator is changed to be modulated into an optical intensity signal corresponding to the voltage. The optical intensity signal is applied to the sampling type high-speed photodetector. In the sampling type high-speed photodetector, the optical intensity signal is sampled so as to be observed as an optical intensity waveform, whereby the voltage from the object is detected. The sampling type high-speed photodetector has large dynamic range, so that even if the output optical intensity signal of the optical modulator includes a DC component, the signal to be detected (i.e., the AC component) can be detected and the operating point of the optical modulator can be determined freely. If the operating point is determined so that the S/N ratio is maximum, then the shot noise can be reduced, with the result that the detection is achieved with high accuracy. Further, it is unnecessary to use the chopper and the lock-in amplifier, and therefore the 1/f noise can be reduced more effectively.

When the optical intensity signal whose level is higher than the allowable input level is applied to the sampling type high-speed photodetector, the sampling type high-speed photodetector may not satisfactorily operate. In this case the optical intensity signal is chopped before applied to the sampling type high-speed photodetector so that the total quantity of light incident to the sampling type high-speed photodetector is made lower than the allowable input level. In this operation, although the total quantity of incident light is decreased, the quantity of light of the optical intensity signal to be sampled is not reduced, and therefore the optical intensity signal can be detected with high accuracy. Especially when the operating point is so determined that the AC component of the optical intensity signal is maximum, the voltage from the object can be detected with higher accuracy and with high linearity.

BRIEF DESCRIPTION OF THE DRAWINGS

FIG. 9 (a) is a time chart indicating the optical intensity of a CW light beam, FIG. 9(b) is a time chart indicating the optical intensity of the chopped CW light beam, FIG. (c) is a time chart indicating a voltage outputted repeatedly by an object being measured, FIG. 9 (d) is a time chart indicating an optical intensity signal and FIG. 9 (e) is a time chart indicating an output signal.

BRIEF DESCRIPTION OF THE INVENTION

Preferred embodiments of this invention will be described with reference to the accompanying drawings.

Figure 1:
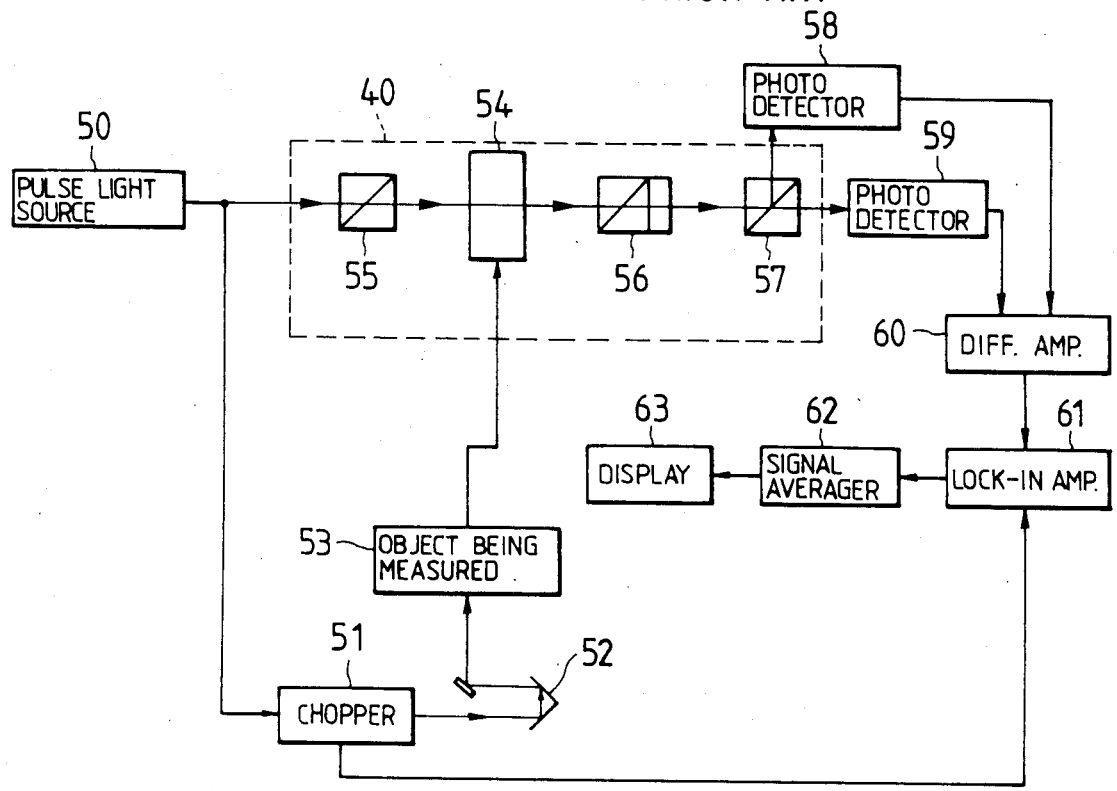
FIGS. 1 and 2 are block diagrams showing the arrangements of the conventional voltage detectors, respectively.
Figure 2:
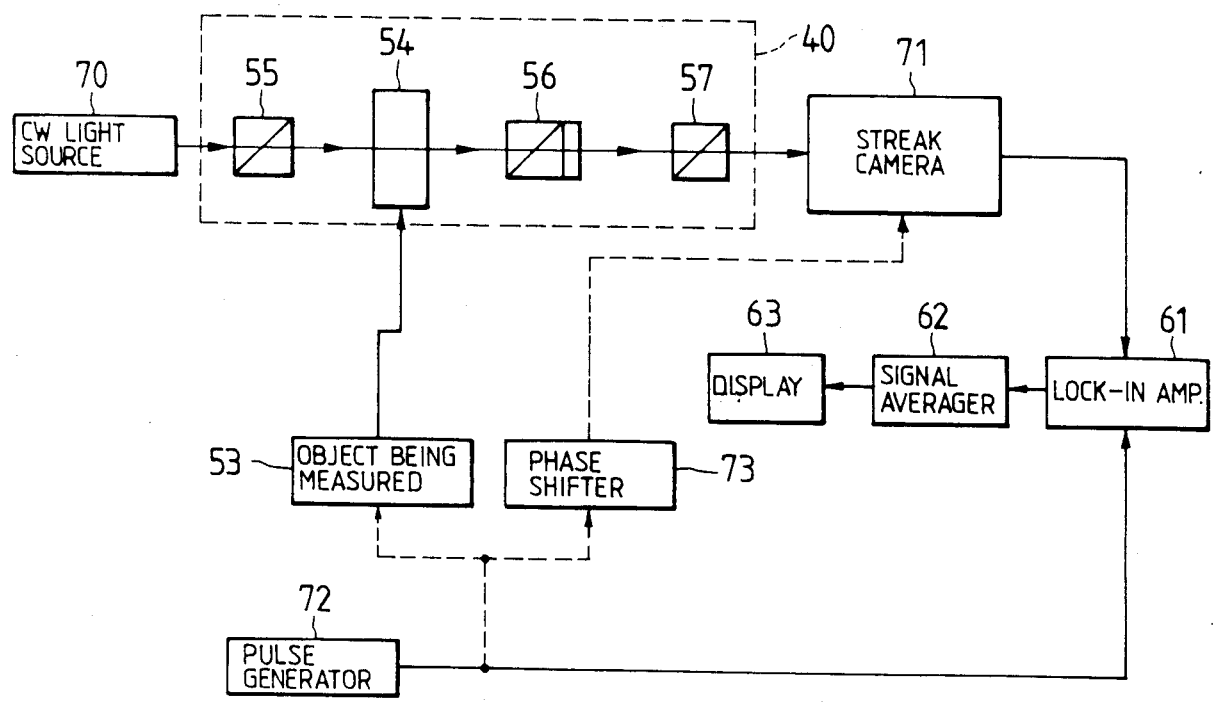
Figure 4:
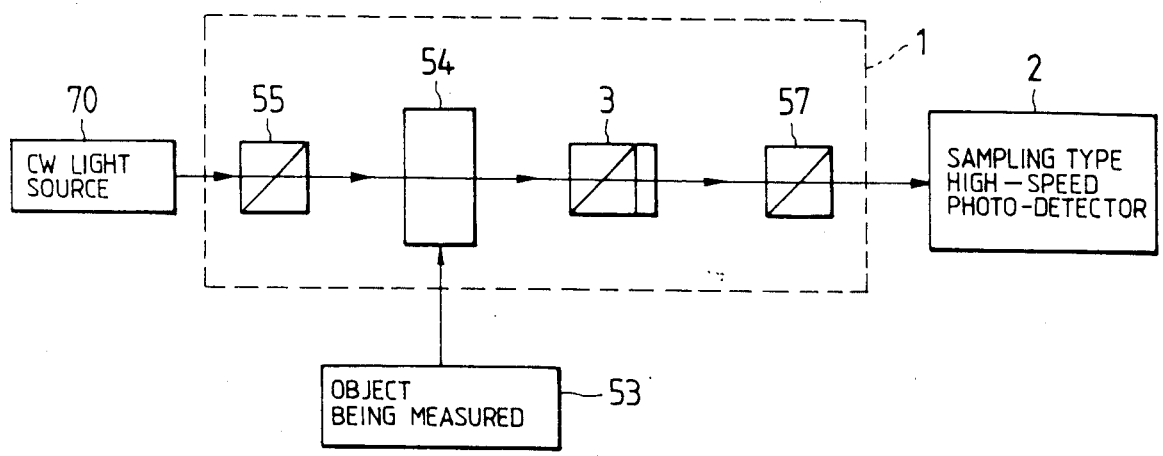
FIG. 4 is a block diagram showing a main part of a first embodiment of a voltage detector according to this invention.

FIG. 4 is a block diagram showing the arrangement of a main part of a first embodiment of a voltage detector according to the invention. In FIG. 4, those components which have been described with reference to FIG. 1 and 2 are designated by the same reference numerals as those in FIGS. 1 and 2.

The voltage detector as shown in FIG. 4, comprises a CW light source 70, and optical modulator 1 for modulating the output CW light beam of the CW light source 70 with the output voltage of an object 53 to provide an optical intensity signal corresponding to the voltage, and a sampling type high-speed photodetector 2 for detecting the optical intensity signal. The CW light source 70 comprises, for instance, a He-Ne laser or a semiconductor laser. The optical modulator 1 comprises a polarizer 55 for extracting a specified polarization component from the CW light beam, a Pockels cell 54 for changing the polarization of the output light beam from the polarizer 55 with the output voltage of the object 53 to provide emergent light beams having various polarization components corresponding to the voltage waveform of the object 53, a phase compensator 3 for adjusting the phases of the emergent light beams from the Pockels cell 54, and an analyzer 57 for extracting an emergent light beam having a specified polarization component from the emergent light beams from the phase compensator 3 to thereby provide an optical intensity signal corresponding to the voltage waveform of the object 53. The phase compensator 3 comprises, for instance, a Soleil-Babinet compensator for changing the phase of the output light beam of the Pockels cell to shift the operating point of the optical modulator 1.

Figure 5:
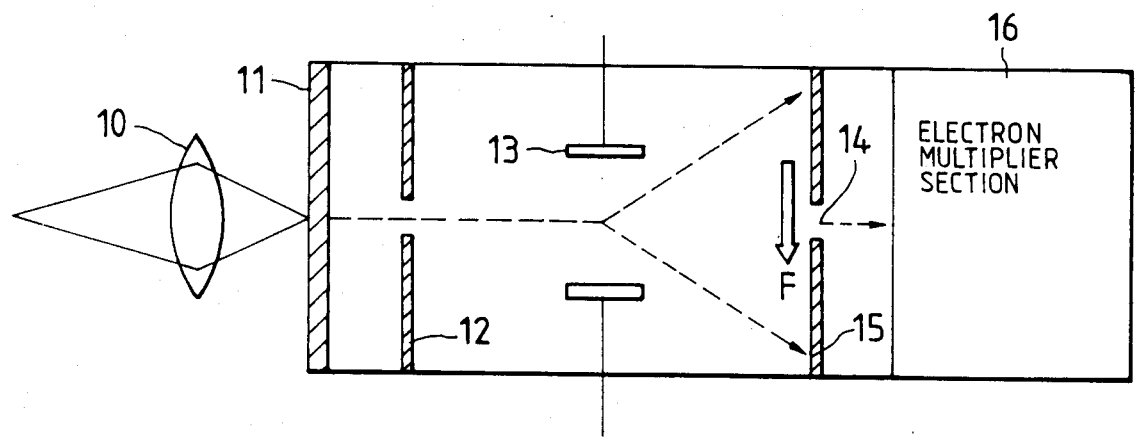
FIG. 5 is a diagram showing the construction of a sampling type photodetector.

FIG. 5 is an explanatory diagram showing the arrangement of the sampling type high-speed photodetector.

The sampling type high-speed photodetector 2 as shown in FIG. 5, comprises a lens 10 for focusing the emergent light beam from the analyzer 57, a photocathode 11 for converting the emergent light beam into an electron beam corresponding to the intensity thereof, an accelerating electrode 12 for accelerating the electron beam, a deflector 13 for sweeping the accelerated electron beam in the direction of the arrow F as shown in FIG. 5, a slit 15 having an opening 14 and an electron multiplier section 16 for receiving electrons passed through the opening 14.

In the sampling type high-speed photodetector 2 thus constructed, the timing of application of a deflecting voltage to the deflector is gradually changed so that parts of the optical intensity signal of the emergent light beam applied repeatedly to the photocathode 11 are successively sampled through the opening 14. The electron multiplier section 16 may be made up of a group of dynodes which directly multiply the electrons passed through the opening 14, or it may comprise, in combination, a phosphor screen which emits light when the electron beam passed through the opening 14 is applied thereto, and a photomultiplier tube which converts the output light beam of the phosphor screen into an electron beam and multiplies the electron beam.

The sampling type high-speed photodetector 2 applies only an electron beam passed through the opening 14 to the electron multiplier section 16 so that it is provided with a larger dynamic range than the general streak camera 71 used in the conventional voltage detector as shown in FIG. 2. This can eliminate the difficulty that the AC component $I_{AC}$ cannot be observed as the optical intensity I of the emergent light beam from the analyzer 57 including the DC component $I_{DC}$.

In the voltage detector thus organized, the phase compensator 3 is adjusted so that the operating point of the optical modulator 1 is set at a desired position. The output CW light beam of the CW light source 70 is applied through the polarizer 55 to the Pockels cell 54, where the polarization thereof is changed by the output voltage of the object 53. The emergent light beams from the Pockels cell are applied to the phase compensator 3, where the phases of the emergent light beams are adjusted. The analyzer 57 extracts the emergent light beam having the specified polarization component from the emergent light beams from the phase compensator 3, and applies it to the sampling type high-speed photodetector 2. In the sampling type high-speed photodetector 2, the optical intensity waveform of the light beam applied thereto is sampled to observe the voltage waveform of the object 53.

As described above, the sampling type high-speed photodetector 2 has a large dynamic range, and therefore even if the optical intensity I of the emergent light beam includes a DC component $I_{DC}$, a small AC component $I_{AC}$ superposed thereon can be observed. Thus, in the voltage detector of the invention, unlike the conventional voltage detector as shown in FIG. 2, it is unnecessary to fix the operating point at B; that is, the operating point may be set at any point between A and B.

Let us consider the determination of the operating point of the optical modulator so as to obtain the maximum S/N ratio.

Figure 3A:
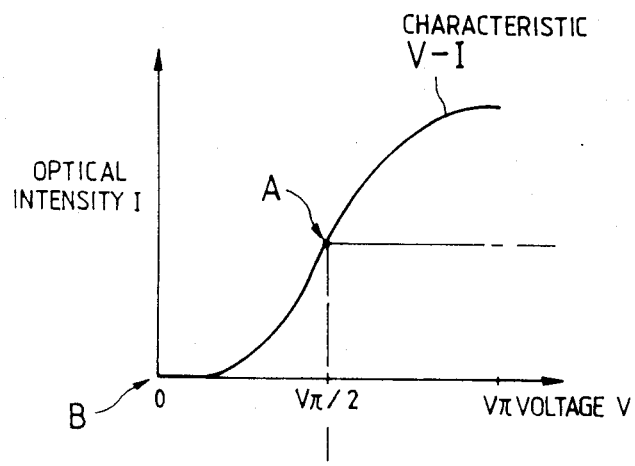
FIG. 3 (a) is a graphical representation for optical intensity I with voltage V, FIG. 3 (b) is a graphical representation indicating a modulating voltage $\Delta V$ provided by an object being measured, and FIG. 3 (c) is a graphical representation indicating an optical intensity I which is provided when the modulating voltage $\Delta V$ as shown in FIG. 3 (b) is applied to the operating point A as shown in FIG. 3 (a)
Figure 3C:
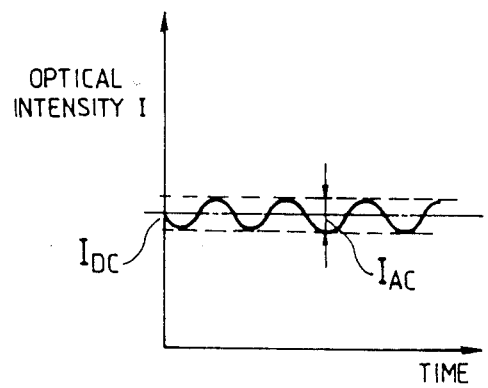
Figure 3B:
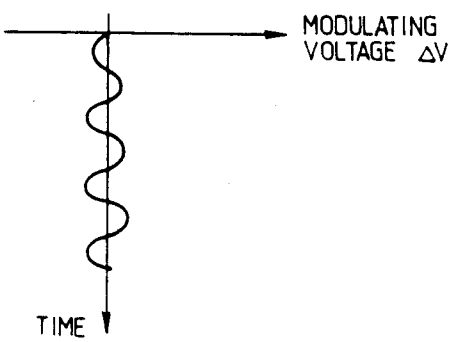

As is apparent from the following equation (1), the optical intensity I of the emergent light beam from the analyzer 57 changes when the voltage V for determining the operating point is changed by adjusting the phase compensator 3, and is provided with a V - I characteristic similar to that as shown in FIG. 3 (a).

$$I = I_0 \sin^2 ((\pi/2) \cdot (V/V_\pi)) \tag{1}$$

where $I_o$ is the optical intensity of the emergent light beam applied to the analyzer 57, and $V\pi$ is the half-wave voltage.

By differentiating equation (1) with the voltage V, the AC component $I_{AC}$ of the optical intensity I, that is, the signal to be detected can be given as follows:

$$I_{AC} = \pi \cdot I_0 \cdot (\Delta V/V_\pi) \cdot \sin((\pi/2) \cdot (V/V_\pi)) \cdot \cos((\pi/2) \cdot (V/V_\pi)) \tag{2}$$

where $\Delta V$ is the modulating voltage provided by the object 53.

Figure 6:
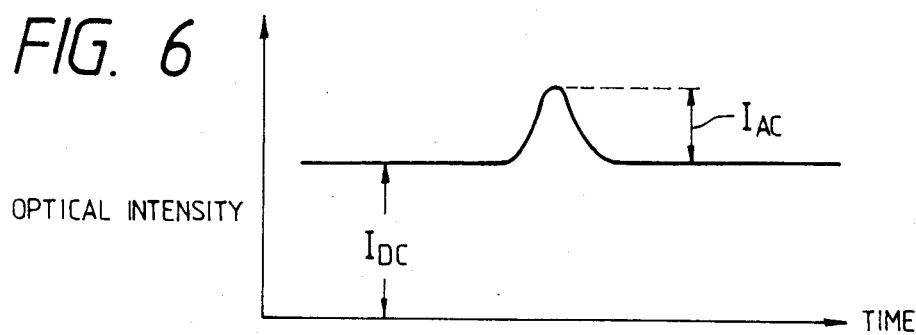
FIG. 6 is a graphical representation showing one example of the optical intensity waveform of an emergent light beam.

When the optical intensity I of the emergent light beam from the analyzer 57 has a waveform as shown in FIG. 6, then the S/N ratio is given as follows:

$$I_{AC}/\sqrt{I_{DC} + I_{AC}} = \pi \sqrt{I_0} (\Delta V/V_\pi) \cdot \cos((\pi/2) \cdot (V/V_\pi))/\sqrt{1 + \pi(\Delta V/V_\pi)/\tan((\pi/2) \cdot (V/V_\pi))} \tag{3}$$

where the noise component is a shot noise having the magnitude represented by $$\sqrt{I}$$

(I is the optical intensity).

Further, the modulation degree MOD is given as follows:

$$I_{AC}/(2 \, I_{DC} + I_{AC}) = \pi(\Delta V/V_\pi) \cdot \sin((\pi/2) \cdot (V/V_\pi)) \cdot$$

$$\cos((\pi/2) \cdot (V/V_\pi))/(2\sin^2((V_\pi/2) \cdot (V/V_\pi)) +$$

$$\pi(\Delta V/V_\pi) \cdot \sin((\pi/2) \cdot (V/V_\pi)) \cdot \cos((\pi/2) \cdot (V/V_\pi)))$$

Figure 7A:
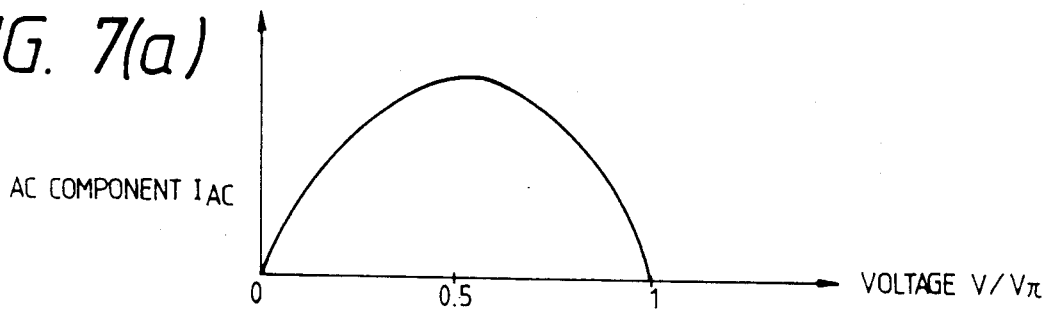
FIGS. 7 (a), 7 (b) and 7 (c) are graphical representations showing the results of calculation of an AC component $I_{AC}$, S/N ratio, and modulation degree MOD, respectively.
Figure 7B:
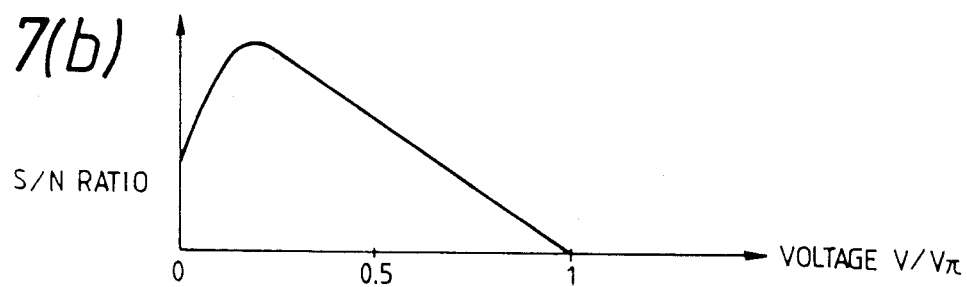
Figure 7C:
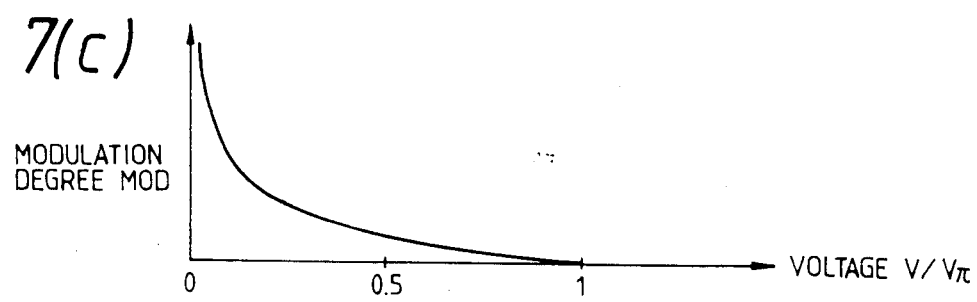

FIGS. 7 (a), 7 (b) and 7 (c) are graphs showing the AC component $I_{AC}$, the S/N ratio, and the modulation degree MOD which are calculated according to the equations (1), (2) and (3), respectively. In FIGS. 7 (a), 7 (b) and 7 (c), each abscissa of the graphs represents $V/V\pi$, that is, the voltage of the object which is normalized with the half-wave voltage $V\pi$. As is apparent from FIGS. 7 (a) and 7 (c), the AC component $I_{AC}$ is maximum when the voltage V for determining the operating point is set at the operating point A as shown in FIG. 3 (a), that is, when $V = V\pi/2$, whereas the modulation degree MOD is maximum when it is set at the operating point B as shown in FIG. 3 (a), that is, when $V = 0$. On the other hand, as is apparent from FIG. 7 (b), the S/N ratio is maximum when $V/V\pi$ is 0.1, and in this case the operating point is positioned between the operating points A and B as shown in FIG. 3 (a).

The DC component $I_{DC}$ of the optical intensity I is affected by the dark light, and therefore even when the operating point is determined with $V = 0$, a DC component $I_d$ due to the dark light exists.

Accordingly, the actual DC component $I_r$ of the optical intensity I is represented as follows:

$$I_r = I_{DC} + I_d \tag{5}$$

In this case, the S/N ratio is represented as follows:

$$I_{AC}/\sqrt{I_r + I_{AC}} = \pi \sqrt{I_0} (\Delta V/V_\pi) \cdot \cos((\pi/2) \cdot (V/V_\pi))/ \tag{6}$$

$$\sqrt{1 + (I_d/I_{DC}) + \pi(\Delta V/V_\pi)/\tan((\pi/2) \cdot (V/V_\pi))}$$

When the operating point is determined from equation (6) so that the S/N ratio is maximum, similarly as in the case where no dark light exists, it is positioned where $V/V\pi = 0.1$. Thus, even with the dark light taken into account, the operating point providing the maximum S/N ratio is immovable, and the result of detection having an excellent S/N ratio can be obtained while the shot noise is reduced by suitably adjusting the phase compensator.

If a pulse light source is employed instead of the CW light source 70, then short pulses of an optical intensity signal are applied to the sampling type high-speed photodetector 2. If a sampling frequency, which may be set above 1 MHz, is so set that the short pulses of the optical intensity signal pass through the opening 14 of the sampling type high-speed photodetector 2, then the optical intensity signal is subjected to amplification in a narrow band in synchronization with the sampling frequency; that is, the sampling type high-speed photodetector 2 could function in the same manner as the lock-in amplifier.

Since the sampling frequency above 1 MHz is much higher than the maximum synchronizing frequency, 100 KHz, of the general lock-in amplifier, the sampling type high-speed photodetector 2 can reduce the noise, especially the 1/f noise more effectively using no chopper and lock in amplifier.

When, in the voltage detector of the first embodiment of the invention, the operating point of the optical modulator is positioned so that the maximum S/N ratio is obtained, not only the shot noise but also the 1/f noise can be greatly reduced, with the result that the detection is achieved with high accuracy.

In the above-described embodiment, the CW light source 70 which is inexpensive and can be handled readily is employed. However, it may be replaced by a pulse light source. In this case, since a short light pulse outputted by the pulse light source is large in spectral width, a wavelength dispersion due to birefringence occurs through the Pockels cell 54, and therefore compensation for the wavelength dispersion is required.

Further, when an optical intensity signal whose level is higher than the allowable input level of the photocathode is applied to the sampling type high-speed photodetector, it may occur that the sampling type high-speed photodetector can not satisfactorily operate. Therefore, to operate the voltage detector of the first embodiment as described above more securely, the optical intensity signal may be chopped before being applied to the sampling type high-speed photodetector so that the total quantity of light incident to the sampling type high-speed photodetector is made lower than the allowable input level. In this case, although the total quantity of incident light is decreased, the quantity of light of the optical intensity signal to be sampled is not reduced, and therefore the optical intensity signal can be detected with high accuracy. Further, especially when the operating point is so determined that the AC component of the optical intensity signal is maximum, the voltage of the object can be detected with higher accuracy and with high linearity.

Figure 8:
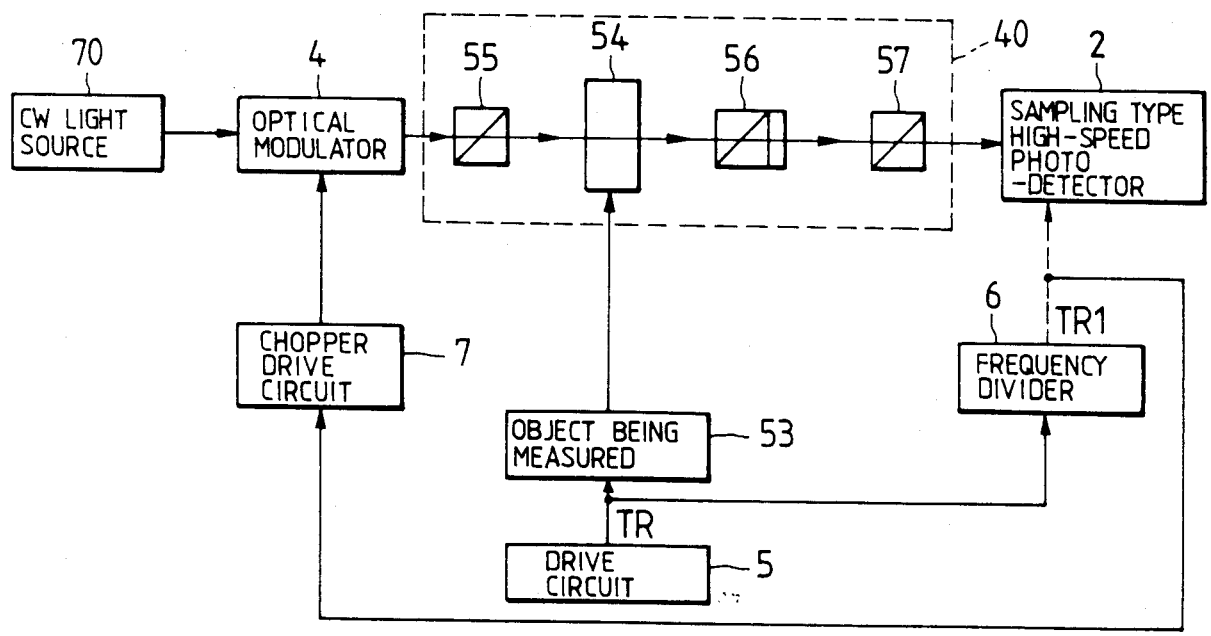
FIG. 8 is a block diagram showing the arrangement of a second embodiment of the voltage detector according to this invention.

FIG. 8 is a block diagram showing the arrangement of a second embodiment of the voltage detector according to the invention. In FIG. 8, those components which have been previously described with reference to FIGS. 1, 2, 4 and 5 are therefore designated by the same reference numerals.

The voltage detector of the second embodiment of the invention as shown in FIG. 8, comprises a CW light source 70; a first optical modulator for chopping the output CW light beam of the CW light source 70 at a predetermined chopping frequency, a second optical modulator 40 for modulating the chopped CW light beam with the output voltage of an object being measured to output the optical intensity signal corresponding to the voltage, and a sampling type high-speed photodetector 2 for detecting the optical intensity signal. The CW light source 70 is, for instance, a He-Ne laser or semiconductor laser and the optical modulator 4 is an acousto-optical modulator or electro-optic modulator, as described in the first embodiment.

In the case where the output CW light beam of the CW light source 70 is large in quantity of light, and with the operating point of the optical modulator 40 set at the point $\underline{A}$ (as shown in FIG. 3 (a)) the optical intensity I of the light beam applied to the photocathode 11 is extremely high, the input to the photocathode 11 exceeds the allowable level thereof and the photocathode 11 is saturated, so that an accurate and secure measurement cannot be achieved In order to overcome this difficulty, a method has been proposed in which an ND filter ( neutral density filter ) is provided in the front stage of the sampling type high-speed photodetector 2 to reduce the optical intensity I applied to the photocathode 11. However, the method suffers from the difficulty that the sensitivity is not efficiently utilized and the wide dynamic range of the sampling type high-speed photodetector 2 is not effectively utilized. In the second embodiment of the invention, instead of the ND filter, an optical modulator or a chopper is provided between the CW light source and the optical modulator 40 to chop the CW light beam, thereby to reduce the quantity of light as a whole, whereas the quantity of light for a detection period is not reduced.

In FIG. 8, a drive circuit 5 operates to output a trigger signal TR to cause the object 53 to output a voltage at a predetermined repetitive frequency. The trigger signal is further applied to a frequency divider 6, where it is frequency-divided to provide a trigger signal TR1. In synchronization with the trigger signal TR1, the deflecting voltage is applied to the deflector 13 in the sampling type high-speed photodetector 2, to thereby deflect the electron beam. The trigger signal TR1 is further applied to the chopper drive circuit 7, so that the chopper drive circuit 7 drives the optical modulator 4 in synchronization with the trigger signal TR1. Thus, the chopping frequency of the optical modulator 4 is made equal to the sampling frequency of the sampling type high-speed photodetector 2.

The operation of the voltage detector thus constructed will be described in detail with reference to FIG. 9(a) to FIG. 9(e).

The repetitive frequency $f_0$ of the trigger signal outputted from the drive circuit 5 is set, for instance, to 100 MHz, and the repetitive frequency $f_0/n$ of the trigger signal TR1 provided by the frequency divider 6 is set to 2MHz (n=50 in this case).

The CW light source 70 outputs a CW light beam having an optical intensity $I_0$ as shown in FIG. 9(a). The CW light beam thus outputted is applied to the optical modulator 4. In the optical modulator 4, the CW light beam is chopped at the chopping frequency $f_0/n$ in response to the signal from the chopper drive circuit 7. As the chopping frequency $f_0/n$ is set to 2 MHz, the chopping repetitive period is 500 nanoseconds as shown in FIG. 9(b). As is apparent from FIG. 9(b), the quantity of light of the chopped CW light beam is equal to the original quantity of light $I_0$ for the period $T_0$, however is zero(0) for the period $T_1$. The CW light beam thus chopped is applied to the optical modulator 40. As a result, the predetermined polarization component is extracted from the CW light beam by the polarizer 55, and in the Pockels cell 54 the polarization is changed according to the output voltage of the object 53. In synchronization with the trigger signal TR having a repetitive frequency $f_0$ (100 MHz), the object 53 produces the voltage at a repetitive frequency of ten nanoseconds as shown in FIG. 9(c). The CW light beam thus chopped and changed in polarization according to the output voltage of the object 53, similarly in the first embodiment as described above, is adjusted in phase by the phase compensator 56 and the predetermined polarization component is extracted therefrom by the analyzer 57, as a result of which the optical intensity signal is outputted by the optical modulator 40. When the phase compensator 56 is so adjusted that the operating point of the optical modulator 40 is set at the point $\underline{A}$ as shown in FIG. 3(a), the optical intensity signal outputted by the optical modulator 40 is as shown in FIG. 9(d), where the AC component $I_{AC}$ is maximum and the DC component $I_{DC}$ is included in the optical intensity signal. The optical intensity signal outputted from the optical modulator 40 is applied to the sampling type high-speed photodetector 2. In the case where the quantity of light $I_0$ of the CW light beam is large and the optical intensity signal is not chopped, the quantity of light (depending on the DC component $I_{DC}$) higher than the allowable level of the photocathode 11 is applied to the photocathode 11 of the sampling type high-speed photodetector 2, so that it is impossible to achieve the photo-electric conversion of the AC component with high accuracy. On the other hand, in this embodiment of the invention, the optical intensity signal is chopped as shown in FIG. 9(d) and the quantity of light applied to the photocathode 11 each period (500 nanoseconds) is reduced to $T_0/(T_0+T_1)$ in comparison with the case where the optical intensity signal is not chopped. Thus, when the quantity of light $I_0$ of the CW light beam is large, the quantity of light applied to the photocathode can be made lower than the allowable level thereof. Therefore, even when the optical intensity signal, the quantity of light of which is not reduced with an ND filter or the like, is applied to the photocathode 11 for the period $T_0$ as shown in FIG. 9(d), the photocathode 11 is not saturated and the photo-electric conversion of the optical intensity signal can be achieved with high accuracy.

The deflecting voltage applied to the deflector 13 in the sampling type high-speed photodetector 2 is in synchronization with the trigger signal TR1, so that the sampling type high-speed photodetector 2 samples the optical intensity signal as shown in FIG. 9(d) at a repetitive period of 500 nanoseconds and outputs a signal as shown in FIG. 9(e). As described above, the sampling type high-speed photodetector has a large dynamic range, so that even if the optical intensity signal subjected to photo-electric conversion is large in amplitude, the electron multiplier section 16 is not saturated and the optical intensity signal can be sampled accurately.

As described above, irrespective of the quantity of light of the CW light beam and the position of the operating point, the CW light beam is chopped in this embodiment so that the total quantity of light incident to the sampling type high-speed photodetector 2 can be reduced. Therefore, the optical intensity signal can be sampled for detection of the voltage, while the quantity of light incident to the sampling type high-speed photodetector 2 is lower than the allowable input level of the photocathode of the sampling type high-speed photodetctor 2.

Further, while the total quantity of light incident to the sampling type high-speed photodetector is reduced, the quantity of light of the optical intensity signal to be sampled is not reduced, and therefore the optical intensity signal can be detected with high sensitivity. Especially when the operating point is set at the position A as shown in FIG. 3(a), the output signal having high linearity can be obtained with high accuracy.

In the above-described embodiment, the optical modulator 4 for chopping the CW light beam is provided between the CW light source 70 and the optical modulator 40. However, the voltage detector may be so modified that the optical modulator 4 is provided between the optical modulator 40 and the sampling type high-speed photodetector 2 so that the optical intensity signal outputted from the optical modulator 40 is chopped.

Further, in the above-described embodiment, the CW light beam outputted from the CW light source 70 is chopped, however, the voltage detector may be modified as follows: Instead of the CW light source 70, a pulse light source may be provided The pulse light source is driven in synchronization with the trigger signal TR1 so that the pulse light from the pulse light source is maintained unchanged in intensity for a period of time longer than the repetitive period of the output voltage of the object 53 being measured In this case, the optical intensity signal chopped can be obtained without the optical modulator 4.

Still further, the sampling type high-speed photodetector 2 used in the first and second embodiments of the invention may comprise a sampling type optical oscilloscope such as the model 00S-01 manufactured by Hamamatsu Photonics Kabushiki Kaisha or a synchro-scan photometer.

As described above, according to the voltage detector of this invention, the output optical intensity signal of the optical modulator is detected with the sampling type high-speed photodetector, so that the operating point of the optical modulator can be freely set to thereby remarkably improve the flexibility of the detector and the 1/f noise can be greatly reduced.

Further, if the operating point of the optical modulator is positioned so that the S/N ratio is maximum, not only the 1/f noise but also the shot noise can be reduced, with the result that the detection is achieved with high accuracy.

Still further, since the optical intensity signal is chopped before being applied to the sampling type high-speed photodetector, even when the quantity of light from the light source is large, the sampling type high-speed photodetector can operate satisfactorily to detect the voltage of the object with high accuracy. Especially when the operating point is so determined that the AC component of the optical intensity signal is maximum, the voltage of the object can be detected with higher accuracy and with high linearity.

What is claimed is:

1. A voltage detector for converting the voltage of an object being measured into an optical intensity signal and measuring the voltage waveform of the object on the basis of the optical intensity signal, comprising:
    a light source for generating light;
    an optical modulator for converting said light from said light source into an optical intensity signal corresponding to the voltage of the object;
    said optical modulator including
    polarizer means for extracting a light beam having a first predetermined polarization component from said light,
    polarization changing means, coupled to receive an output light beam from said polarizer means, for providing emergent light beams having various polarization components corresponding to the voltage waveforms of the object being measured,
    phase compensator means for adjusting phases of the emergent light beams from the polarization changing means, and
    analyzer means for extracting one of the emergent light beams having a second predetermined polarization component to thereby provide the optical intensity signal,
    a sampling type high-speed photodetector for sampling said optical intensity signal from said optical modulator measuring the voltage waveform of the object on the basis of said sampled optical intensity signal; and
    wherein said phase compensator means has an adjustable setting value for determining an optical intensity and a signal-to-noise ratio of the optical intensity signal, the setting value of said phase compensator means being adjusted so that the signal-to-noise ratio of the optical intensity signal is substantially maximized.

2. A voltage detector as claimed in claim 1, wherein said sampling type high-speed photodetector comprises a streak tube having a slit for sampling said optical intensity signal.

3. A voltage detector as claimed in claim 1, wherein said sampling type high-speed photodetector is a sampling type optical oscilloscope.

4. A voltage detector as claimed in claim 1, wherein said sampling type high-speed photodetector is a synchro-scan photometer.

5. A voltage detector as claimed in claim 1, wherein said light source comprises a CW light source.

6. A voltage detector as claimed in claim 1, wherein said light source comprises a pulse light source.

7. A voltage detector as claimed in claim 1, wherein said sampling type high-speed photodetector comprises a photocathode for converting said optical intensity signal into an electron beam, a deflector for sweeping said electron beam in a predetermined direction, a slit for extracting a part of said electron beam at a predetermined sampling period, and electron multiplying means for converting said extracted electron beam into an amplified electrical signal.

8. A voltage detector as claimed in claim 7, wherein said electron multiplying means comprises a group of dynodes.

9. A voltage detector for converting the voltage of an object being measured into an optical intensity signal and measuring the voltage waveform of the object on the basis of the optical intensity signal, comprising:
 a light source for generating light;
 an optical modulator for converting said light from said light source into an optical intensity signal corresponding to the voltage of the object;
 a sampling type high-speed photodetector for sampling said optical intensity signal from said optical modulator and measuring the voltage waveform of the object on the basis of said sampled optical intensity signal;
 chopper means for chopping said light from said light source at a predetermined frequency before being applied to said sampling type high-speed photodetector, thereby reducing the total quantity of light applied to said sampling type high-speed photodetector, said optical modulator coupled to receive an output of said chopper means; and
 drive means for applying a trigger signal to both of said chopper means and said sampling type high-speed photodetector so that said chopper means is actuated in synchronism with said sampling type high-speed photodetector.

10. The voltage detector of claim 1 wherein said sampling type high-speed photodetector is a streak tube having a slit for sampling said optical intensity signal.

11. The voltage detector of claim 1 wherein said light source comprises a pulse light source.

12. The voltage detector of claim 9 wherein said light source generates continuous wave light.

* * * * *

UNITED STATES PATENT AND TRADEMARK OFFICE
CERTIFICATE OF CORRECTION

PATENT NO. : 4,975,635
DATED : December 04, 1990
INVENTOR(S) : Hironori Takahashi et al.

It is certified that error appears in the above-identified patent and that said Letters Patent is hereby corrected as shown below:

On the title page, Item [73]

Please delete "Hironoir Takahashi" as the Assignee and insert --Hamatsu Photonics Kabushiki Kaisha--.

Signed and Sealed this

Ninth Day of March, 1993

Attest:

STEPHEN G. KUNIN

Attesting Officer

Acting Commissioner of Patents and Trademarks